United States Patent
Jung et al.

(10) Patent No.: US 7,246,250 B2
(45) Date of Patent: Jul. 17, 2007

(54) MEMORY DEVICE CONTROLS DELAY TIME OF DATA INPUT BUFFER IN RESPONSE TO DELAY CONTROL INFORMATION BASED ON A POSITION OF A MEMORY DEVICE RECEIVED FROM MEMORY CONTROLLER

(75) Inventors: Tae-sung Jung, Seoul (KR); Won-ki Song, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 618 days.

(21) Appl. No.: 09/941,091

(22) Filed: Aug. 28, 2001

(65) Prior Publication Data

US 2002/0026600 A1    Feb. 28, 2002

(30) Foreign Application Priority Data

Aug. 28, 2000  (KR) ............... 2000-50164

(51) Int. Cl.
*G06F 1/12*    (2006.01)
(52) U.S. Cl. .................................. 713/401
(58) Field of Classification Search ......... 713/500, 713/600, 401; 711/167
See application file for complete search history.

(56) References Cited

U.S. PATENT DOCUMENTS

| | | | | |
|---|---|---|---|---|
| 5,276,858 A * | 1/1994 | Oak et al. | .................. | 711/167 |
| 5,418,924 A | 5/1995 | Dresser | ..................... | 391/425 |
| 5,557,782 A * | 9/1996 | Witkowski et al. | ......... | 713/600 |
| 5,576,997 A | 11/1996 | Masuda et al. | ........ | 365/189.04 |
| 5,646,904 A * | 7/1997 | Ohno et al. | .................. | 365/233 |
| 5,778,446 A * | 7/1998 | Kim | ........................... | 711/167 |
| 5,892,981 A * | 4/1999 | Wiggers | ..................... | 710/58 |
| 5,946,712 A | 8/1999 | Lu et al. | ..................... | 711/167 |
| 5,953,263 A * | 9/1999 | Farmwald et al. | ......... | 365/194 |
| 5,986,945 A * | 11/1999 | Zheng | ................... | 365/189.05 |
| 6,026,051 A * | 2/2000 | Keeth et al. | ................ | 365/233 |
| 6,049,489 A * | 4/2000 | Merritt | .................. | 365/189.05 |
| 6,101,197 A * | 8/2000 | Keeth et al. | ................ | 370/517 |
| 6,111,796 A * | 8/2000 | Chang et al. | ............... | 365/196 |
| 6,266,285 B1 * | 7/2001 | Farmwald et al. | ......... | 365/194 |
| 6,289,468 B1 * | 9/2001 | Godfrey | .................... | 713/401 |
| 6,418,495 B1 * | 7/2002 | Ryan | ......................... | 710/308 |
| 6,438,670 B1 * | 8/2002 | McClannahan | ............ | 711/167 |

(Continued)

FOREIGN PATENT DOCUMENTS

EP          0855653 A1 *    7/1998

(Continued)

OTHER PUBLICATIONS

Notice to Submit Response, Korean Application No. 10-2000-0050164, Sep. 26, 2002.

*Primary Examiner*—Chun Cao
(74) *Attorney, Agent, or Firm*—Myers, Bigel, Sibley & Sajovec, P.A.

(57) ABSTRACT

An integrated circuit memory system includes one or more memory modules in which at least one of the memory modules is responsive to a control signal and has delay control information stored thereon. The memory system further includes a memory controller that is configured to generate the control signal in response to the delay control information.

35 Claims, 5 Drawing Sheets

U.S. PATENT DOCUMENTS

6,842,864 B1 * 1/2005 Barth et al. .................. 713/401
2002/0161965 A1 * 10/2002 Ryan .......................... 711/105

FOREIGN PATENT DOCUMENTS

| JP | 7084863 | 11/1996 | |
| JP | 10232818 | 7/1998 | |
| JP | 411110280 A | * 4/1999 | |

* cited by examiner

MEMORY DEVICE CONTROLS DELAY TIME OF DATA INPUT BUFFER IN RESPONSE TO DELAY CONTROL INFORMATION BASED ON A POSITION OF A MEMORY DEVICE RECEIVED FROM MEMORY CONTROLLER

CROSS REFERENCE TO RELATED APPLICATION

This application claims the benefit of Korean Application No. 2000-50164, filed Aug. 28, 2000, the disclosure of which is hereby incorporated herein by reference.

BACKGROUND OF THE INVENTION

The present invention relates generally to the field of integrated circuit devices, and, more particularly, to signal distribution circuitry used in integrated circuit devices.

Signal transmission times between respective memory devices in a memory system may differ based on the positions of the memory devices. The signal transmission times between signals following similar length paths may also differ due to skew between the signals. Differences in signal transmission times and/or skew may reduce a valid data window for determining a maximum operating frequency and may increase setup times and hold times for signals.

To compensate for skew, conventional memory devices and controllers may include a phase locked loop (PLL) or a delay locked loop (DLL). Unfortunately, this may increase the size of the memory device. Also, designing the PLL or DLL may cause difficulties in developing the memory device.

Figure 1:
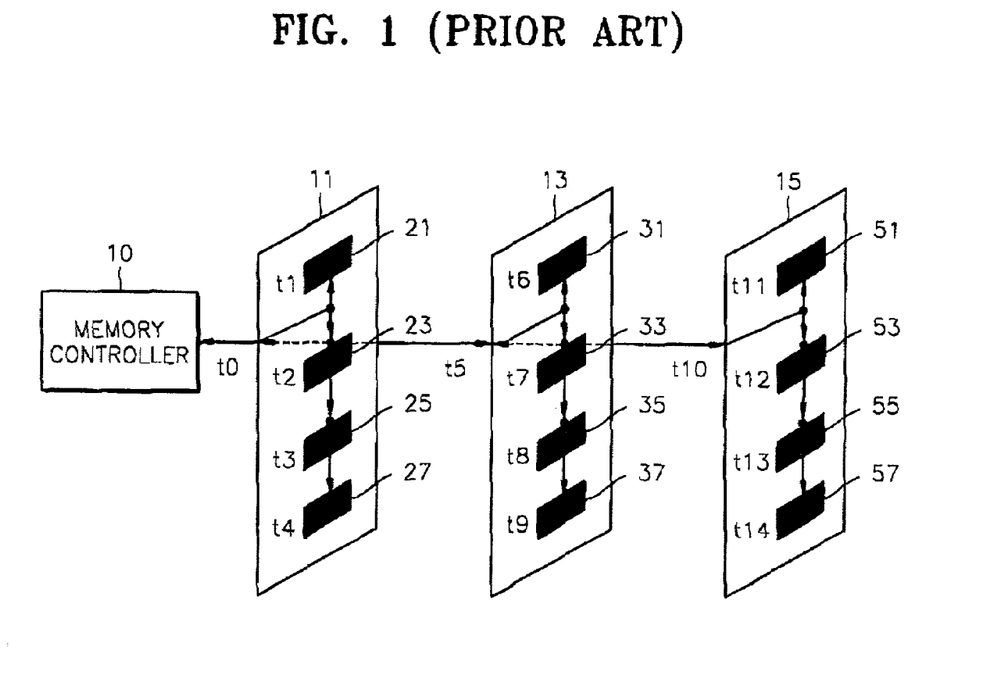
FIG. 1 is a schematic that illustrates a conventional memory system.
Figure 2:
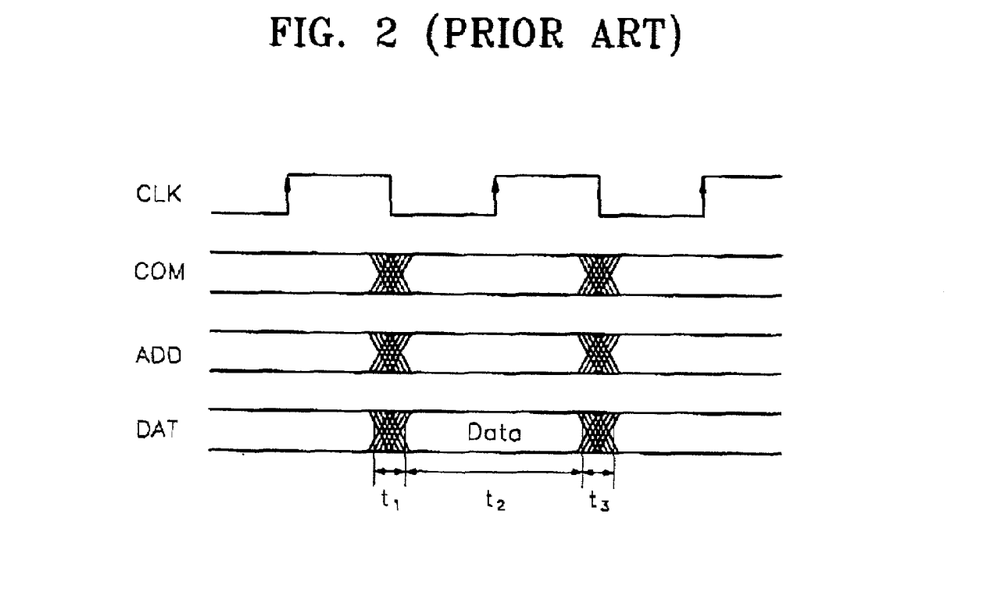
FIG. 2 is a timing diagram that illustrates skew between signals generated in the memory system of FIG. 1.

FIG. 1 is a schematic of a conventional memory system that illustrates different signal delays between modules and/or memory devices. FIG. 2 is a timing diagram that illustrates skew between signals and the reduction of a valid data window due to the skew.

Referring now to FIG. 1, a conventional memory system comprises a plurality of memory modules 11, 13, and 15 controlled by a memory controller 10. The transmission time of a signal between a memory module 11, 13, or 15 and the memory controller 10 varies according to the position of the memory module 11, 13, or 15. For example, the transmission time of a signal between the memory module 11 and the memory controller 10 is t0 and the transmission time between the memory module 15 and the memory controller 10 is t10.

Memory module 11 comprises a plurality of memory devices 21, 23, 25, and 27. The transmission time of a signal between the memory controller 10 and one of the memory devices 21, 23, 25, or 27 varies according to the position of the memory device 21, 23, 25, or 27. For example, the transmission time of a signal between the memory device 21 and the memory controller 10 is t1 and the transmission time between the memory device 27 and the memory controller 10 is t4.

Thus, the transmission time of a signal between the memory controller 10 and a memory module 11, 13, or 15 varies according to the position of the memory module. Furthermore, the transmission time of a signal between the memory controller and a memory device 21, 23, 25, or 27 varies according to the position of the memory device. Similar principles apply to memory module 13, which comprises memory devices 31, 33, 35, and 37, and memory module 15, which comprises memory devices 51, 53, 55, and 57.

Referring now to FIG. 2, time t1 illustrates a data setup time that is increased due to skew between signals and/or differences in signal transmission time between the memory controller 10 and the memory modules 11, 13, and 15 and/or the memory devices contained therein. Time t3 illustrates a data hold time that is increased due to skew between signals and/or differences in signal transmission time between the memory controller 10 and the memory modules 11, 13, and 15 and/or the memory devices contained therein. Time t2 denotes a valid data window reduced by the times t1 and t3.

In a conventional memory system, various integrated circuit memory devices, such as memory devices 21, 31, and 51, may be connected to each other and there may be differences in transmission time for signals between the memory controller 10 and the memory devices 21, 31, and 51 based on the position of the memory device 21, 31, and 51. In addition, skew may exist between signals. The differences in signal transmission time and/or skew may increase the data setup time and/or the data hold time, and may reduce the valid data window for determining the maximum operating frequency of the memory system.

To compensate for skew and/or the differences in signal transmission time, a memory device and/or a memory controller may use a PLL and/or a DLL. Unfortunately, incorporating a PLL and/or a DLL into memory systems may increase the size of the memory systems. Also, designing a PLL and/or DLL may increase the development complexity of memory systems.

SUMMARY OF THE INVENTION

Embodiments of the present invention provide integrated circuit memory systems, memory controllers, memory devices, and methods of operating same. For example, in some embodiments, an integrated circuit memory system comprises one or more memory modules in which at least one of the memory modules is responsive to a control signal and has delay control information stored thereon. The memory system further comprises a memory controller that is configured to generate the control signal in response to the delay control information.

In further embodiments, the memory controller comprises a delay control register that is configured to receive and to store the delay control information therein and an output buffer that is configured to generate the control signal in response to an input control signal and the delay control information stored in the delay control register.

In still further embodiments, the memory controller comprises an input buffer that is configured to receive data from one or more of the memory modules at an input thereof and to provide the received data at an output thereof in response to the delay control information stored in the delay control register.

In other embodiments, the control signal comprises a command control signal, an address control signal, and data, and the output buffer comprises a command output buffer that is configured to generate the command control signal in response to an input command control signal and the delay control information stored in the delay control register, an address output buffer that is configured to generate the address control signal in response to an input address control signal and the delay information stored in the delay control register, and a data output buffer that is configured to generate the data in response to input data and the delay information stored in the delay control register.

In still other embodiments, at least one of the memory modules comprises a plurality of memory devices. Moreover, at least one of the memory devices comprises a delay control register that is configured to receive at least some of the delay control information and to store that information therein, an input buffer that is configured to generate a second control signal in response to the control signal output from the controller and the delay control information stored in the delay control register, and a memory cell array that is responsive to the second control signal.

Thus, in accordance with embodiments of the present invention, differences in signal transmission times between a memory controller and memory devices may be reduced by delaying signals at the memory controller and/or the memory devices. The operating frequency of a memory system may be improved by reducing signal skew between signals destined for different memory devices in the memory system.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 3:
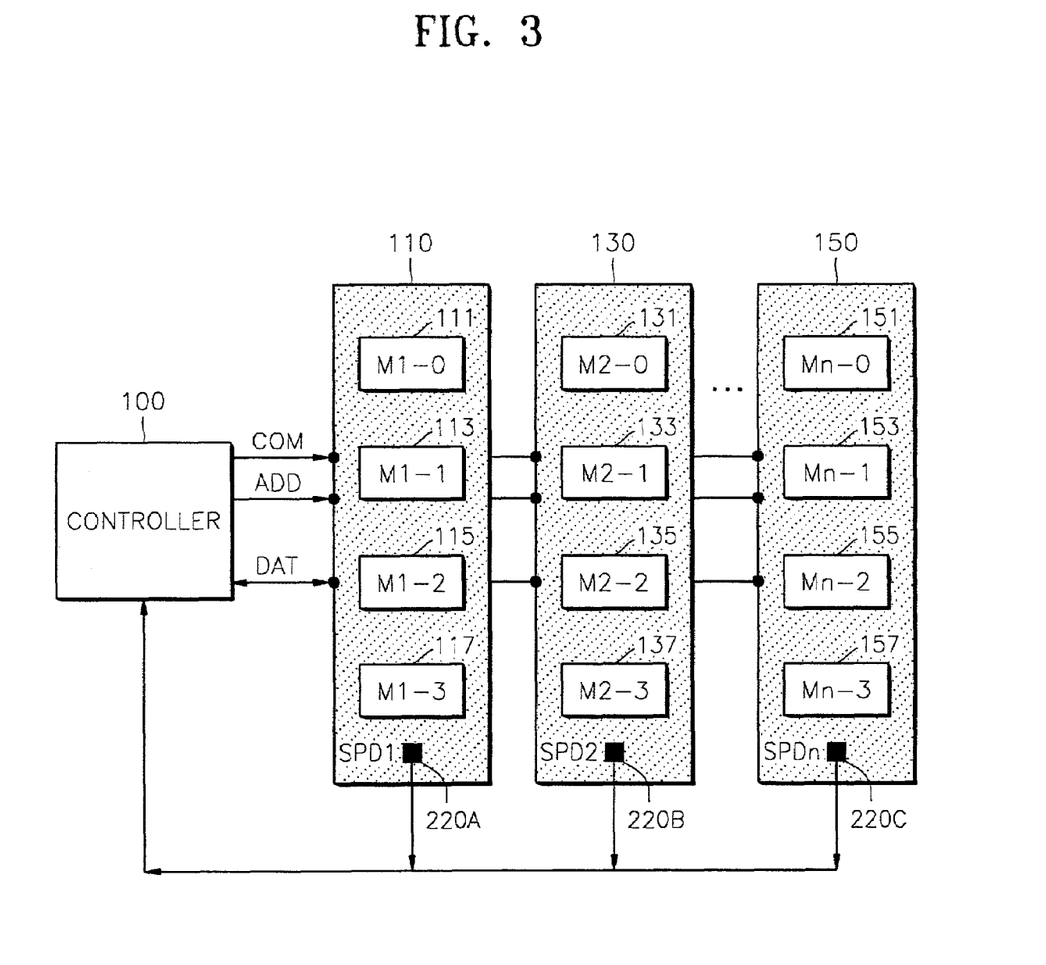
FIG. 3 is a block diagram that illustrates memory systems in accordance with embodiments of the present invention.

FIG. 3 illustrates a memory system, in accordance with embodiments of the present invention, that comprises a controller 100 and a plurality of memory modules 110, 130, and 150. Memory module 110 comprises a plurality of memory devices 111, 113, 115, and 117. Memory module 130 comprises a plurality of memory devices 131, 133, 135, and 137. Memory module 150 comprises a plurality of memory devices 151, 153, 155, and 157. The memory modules 110, 130, and 150 further comprise serial presence detectors (SPDs), 220A, 220B, and 220C, respectively.

SPD1 220A stores information on the positions of the memory devices 111, 113, 115, and 117 in the memory module 110. The SPD1 220A stores additional information, such as the respective wiring distances from the controller 100 to the memory devices 111, 113, 115, and 117 and operating conditions that are associated with the wiring distance (e.g., operation voltages based on the length and the conductivity of a wiring material). This information may be recorded in the SPD1 220A during design of the memory interface. SPD2 220B and SPDn 220C store similar information for memory modules 130 and 150, respectively.

During initialization of the memory system, information on the respective memory modules 110, 130, and 150 is sent from the SPD1 220A, SPD2 220B, and/or SPDn 220C to the controller 100 through a serial bus. Therefore, the controller 100 may obtain the positions of the memory modules 110, 130, and 150 and the memory devices 111 through 157.

Figure 4:
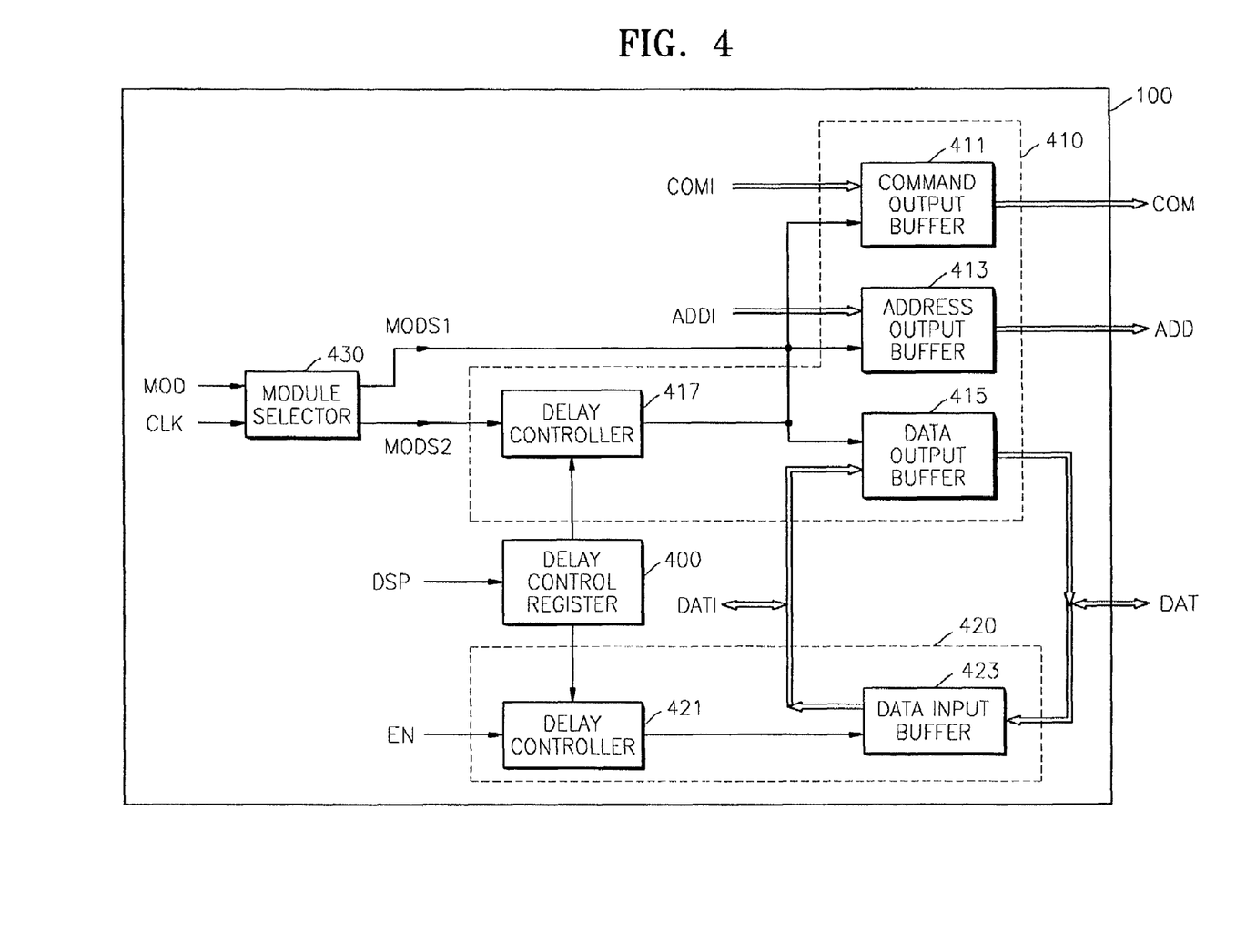
FIG. 4 illustrates memory controllers in accordance with embodiments of the present invention.

FIG. 4 illustrates the memory controller 100 in accordance with embodiments of the present invention. The memory controller 100 comprises a delay control register 400, an output buffer 410, and a module selector 430. The delay control register 400 receives delay control information DSP from SPD1 220A, SPD2 220B, and/or SPDn 220C. The module selector 430 generates the module selection signals MODS1 and MODS2 for selecting a specific memory module 110, 130, or 150 in response to a clock signal CLK and a module address signal MOD.

The output buffer 410 comprises a delay controller 417, a command output buffer 411, an address output buffer 413, and a data output buffer 415. In other embodiments, the delay controller 417 may be viewed as a separate component from the output buffer 410. The output buffer 410 applies a delay to an internal command signal COMI, an internal address signal ADDI, and internal write data DATI to generate a command signal COM, an address signal ADD, and write data DAT, respectively, in response to the module selection signals MODS1 and MODS2. The delay that is applied by the output buffer 410 is based on the delay control information contained in the delay control register 400.

The delay controller 417 generates an output signal specifying a delay time in response to the delay control information contained in the delay control register 400 and the module selection signal MODS2. The command output buffer 411 delays the internal command signal COMI in response to the output signal of the delay controller 417 and the module selection signal MODS1. The address output buffer 413 delays the internal address signal ADDI in response to the output signal of the delay controller 417 and the module selection signal MODS1. The data output buffer 415 delays the write data DATI in response to the output signal of the delay controller 417 and the module selection signal MODS1.

The memory controller 100 further comprises an input buffer 420. The input buffer 420 comprises a delay controller 421 and a data input buffer 423. In other embodiments, the delay controller 421 may be viewed as a separate component from the input buffer 420. The delay controller 421 generates an output signal specifying a delay time in response to the delay control information contained in the delay control register 400 and an enable signal EN. The data input buffer 423 applies a delay to read data DAT, which are received from the memory devices 111 through 157, in response to the output signal of the delay controller 421. The input buffer 420 then provides the read data to other circuitry of the memory controller 100 after expiration of the delay time.

Referring again to FIG. 3, for purposes of illustration, it is assumed that the memory system comprises eight total memory modules, with memory modules 110, 130, and 150 representing the first, second, and eighth modules, respectively. It will be understood, however, that memory systems may contain more or fewer memory modules in accordance with other embodiments of the present invention. During initialization of the memory system, the delay control register 400 reads the information contained in the SPDs 220A, 220B, and 220C and may associate respective transmission delay values with the memory modules 110, 130, through 150, and may also associate respective transmission delay values with the memory devices 111 through 157 contained in the memory modules 110, 130 through 150, based on the characteristics of a signal received with respect to the memory modules 110, 130, through 150 and the memory devices 111 through 157 by a basic input/output system (BIOS). In other words, a transmission delay value represents a duration of time that it takes a signal to travel from the memory controller 100 to a memory module and/or a memory device.

When writing data to one of the memory modules 110, 130, through 150, if the module address signal MOD corresponds to a memory module that has a transmission delay value associated therewith that is greater than or equal to the transmission delay values associated with the other memory modules, then the module selector 430 activates the module selection signal MODS1 and deactivates the module selection signal MODS2 in response to the clock signal CLK Because the module selection signal MODS2 is deactivated, the delay controller 417 is disabled. Therefore, the internal command signal COMI, the internal address signal ADDI, and the write data DATI may be output as the command signal COM, the address signal ADD, and data DAT without any delay based on the delay control information stored in the delay control register 400 being applied thereto by the output buffer 410. In the example shown in FIG. 3, memory module 150 may correspond to the memory module that has the greatest transmission delay value associated therewith as it is located the farthest from the memory controller 100. Likewise, memory device 157 may correspond to a memory device that has the greatest transmission delay value associated therewith as it is located the farthest from the memory controller 100. It will be understood, however, that in other embodiments of the present invention, the memory module and/or the memory device with the greatest transmission delay value associated therewith may not necessarily be located the farthest distance away from the memory controller.

If, however, the module address signal MOD corresponds to a memory module that has a transmission delay value associated therewith that is less than one or more transmission delay values associated with other memory modules, then the module selector 430 deactivates the module selection signal MODS1 and activates the module selection signal MODS2 in response to the clock signal. In the example of FIG. 3, if the module address signal MOD corresponds to any memory module other than memory module 150, then the module selection signal MODS1 is deactivated and the module selection signal MODS2 is activated.

The delay controller 417 generates an output signal specifying a delay time in response to the delay control information contained in the delay control register 400 and the module selection signal MODS2. The delay time is a value, which is determined based on previously obtained SPD information, for reducing skew between signals transmitted between the memory controller and the memory modules 110, 130, and 150, and for reducing differences in signal delays for signals transmitted between the memory controller and the memory modules 110, 130, and 150. The delay time is applied to signals received at the command output buffer 411, the address output buffer 413, and the data output buffer 415. Therefore, the command signal COM, the address signal ADD, and the write data DAT are generated by delaying the internal command signal COMI, the internal address signal ADDI, and the write data DATI, respectively, by the delay time specified by the output signal of the delay controller 417.

When reading data from one of the memory modules 110, 130, through 150, if data is being read from a memory device contained in a memory module that has a transmission delay value associated therewith that is greater than or equal to the transmission delay values associated with the other memory modules (e.g., memory device 157 of memory module 150 as discussed above), then the input buffer 420 may provide read data to other circuitry of the memory controller 100 without any delay based on the delay control information stored in the delay control register 400 being applied thereto by the data input buffer 423. If, however, data is being read from a memory device contained in a memory module that has a transmission delay value that is less than one or more transmission delay values associated with other memory modules (e.g., memory devices 111 through 137 of memory modules 110 and 130 as discussed above), then the delay controller 421 generates an output signal specifying a delay time in response to the delay control information contained in the delay control register 400 and the enable signal EN. The data input buffer 423 applies the delay time to read data DAT, which are received from the memory devices 111 through 157, in response to the output signal of the delay controller 421. The input buffer 420 then provides the read data to other circuitry of the memory controller 100 after expiration of the delay time.

FIG. 4 illustrates methods of operating memory systems, memory controllers, and memory modules in accordance with embodiments of the present invention. Memory systems operate by controlling the delay that is applied to signals output from the memory controller 100 and destined for the memory modules 110, 130, through 150, and by controlling the delay that is applied to data received from the memory modules 110, 130, through 150 at the memory controller 100.

Delay control information DSP is received from the SPD1 220A, SPD2 220B, and/or SPDn 220C and is stored in the delay control register 400. The module selector 430 activates a module selection signal MODS1 or MODS2 for selecting one of the memory modules 110, 130, and 150 in response to the clock signal CLK. The delay controllers 417 and 421 generate respective output signals specifying a delay time in response to the delay control information contained in the delay control register 400. The module selector 430 activates the module selection signal MODS1 and deactivates the module selection signal MODS2 if the memory module to be written to has a transmission delay value associated therewith that is greater than or equal to the transmission delay values associated with the other memory modules. Conversely, the module selector 430 activates the module selection signal MODS2 and deactivates the module selection signal MODS1 if the memory module to be written to has a transmission delay value associated therewith that is less than one or more transmission delay values associated with other memory modules. The module selection signals MODS1 and MODS2 control whether the output buffer 410 applies a delay time received from the delay controller 417 to the internal command signal COMI, the internal address signal ADDI, and the write data DATI, to generate the command signal COM, the address signal ADD, and the write data DAT.

If data is being read from a memory device contained in a memory module that has a transmission delay value associated therewith that is greater than or equal to the transmission delay values associated with the other memory modules (e.g., memory device 157 of memory module 150 as discussed above), then the input buffer 420 may provide read data to other circuitry of the memory controller 100 without any delay based on the delay control information stored in the delay control register 400 being applied thereto by the data input buffer 423. If, however, data is being read from a memory device contained in a memory module that has a transmission delay value that is less than one or more transmission delay values associated with other memory modules (e.g., memory devices 111 through 137 of memory modules 110 and 130 as discussed above), then the delay controller 421 generates an output signal specifying a delay time in response to the delay control information contained in the delay control register 400 and the enable signal EN. The data input buffer 423 applies the delay time to read data DAT, which are received from the memory devices 111 through 157, in response to the output signal of the delay controller 421. The input buffer 420 then provides the read data to other circuitry of the memory controller 100 after expiration of the delay time.

Figure 5:
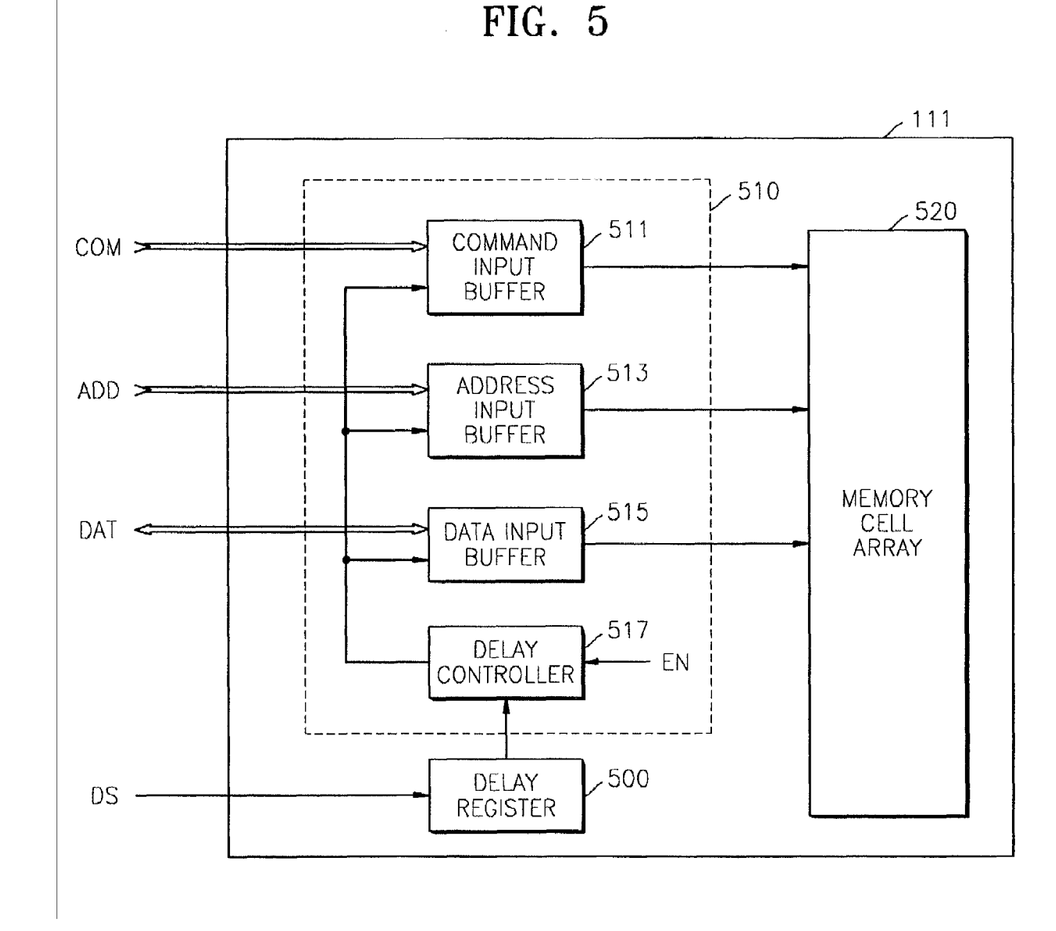
FIG. 5 illustrates memory devices in accordance with embodiments of the present invention.

FIG. 5 illustrates the memory device 111 in more detail, in accordance with embodiments of the present invention. The other memory devices 113 through 157 may be configured similarly to memory device 111, in accordance with embodiments of the present invention. Memory device 111 comprises a delay control register 500, an input buffer 510, and a memory cell array 520. The delay control register 500 receives delay control information DS from the memory controller 100 and stores the received delay control information DS. The delay control register 500 receives the delay control information DS and sets a delay time for the memory device 111, which is based on respective delay times for other memory devices 113 through 157, during initialization of the memory system.

The input buffer 510 receives a command signal COM, an address signal ADD, and write data DAT from the memory controller 100, which have been generated by applying a delay to the internal command signal COMI, the internal address signal ADDI, and the write data DATI, respectively. Note that for a memory device that has the greatest transmission delay value associated therewith (e.g., memory device 157), the command signal COM, the address signal ADD, and the write data DAT correspond to the internal command signal COMI, the internal address signal ADDI, and the write data DATI. The input buffer 510 applies a delay to the received command signal COM, the address signal ADD, and the write data DAT. The delay time applied by the input buffer 510 is based on the delay control information for the device 111, which is stored in the delay control register 500.

The input buffer 510 comprises a command input buffer 511, an address input buffer 513, a data input buffer 515, and a delay controller 517. In other embodiments, the delay controller 517 may be viewed as a separate component from the input buffer 510. The delay controller 517 generates an output signal specifying a delay time in response to the delay control information contained in the delay control register 500 and an enable signal EN.

The data input buffer 515 delays the write data DAT by the delay time and buffers the delayed write data DAT in response to the output signal of the delay controller 517. The address input buffer 513 delays the address signal ADD by the delay time and buffers the delayed address signal ADD in response to the output signal of the delay controller 517. The command input buffer 511 delays the command signal COM by the delay time and buffers the delayed command signal COM in response to the output signal of the delay controller 517.

In general, in a memory device that has the greatest transmission delay associated there with, the input buffer 510 does not apply any additional delay to incoming signals. For example, assuming memory device 157 has the greatest transmission delay value associated therewith, when data is written to the memory device 157, the input buffer for memory device 157 does not apply additional delay based on delay control information stored in a delay register. By contrast, when data is written to the memory device 111, which is close to the memory controller 100 and has a relatively short transmission delay time associated therewith, the input buffer 510 applies a relatively long delay to the received command signal COM, address signal ADD, and data DAT. When data is being read from one of the memory devices 111 through 157, any additional delay time applied to the read data is controlled by the memory controller 100 as discussed hereinabove.

FIG. 5 illustrates methods of operating memory devices in accordance with embodiments of the present invention. Referring to FIG. 5, the delay control information DS is received from the memory controller 100 in the delay register 500. The delay controller 517 generates an output signal specifying a delay time in response to the delay control information contained in the delay control register 500 and an enable signal EN. The input buffer 510 delays an input signal received from, for example, a memory controller by the delay time. The input signal may comprise a command signal, an address signal, and write data.

Therefore, in accordance with embodiments of the present invention, differences in signal transmission times between a memory controller and memory devices may be reduced by delaying signals at the memory controller and/or the memory devices. The operating frequency of a memory system may be improved by reducing signal skew between signals destined for different memory devices in the memory system.

Figure 6A:
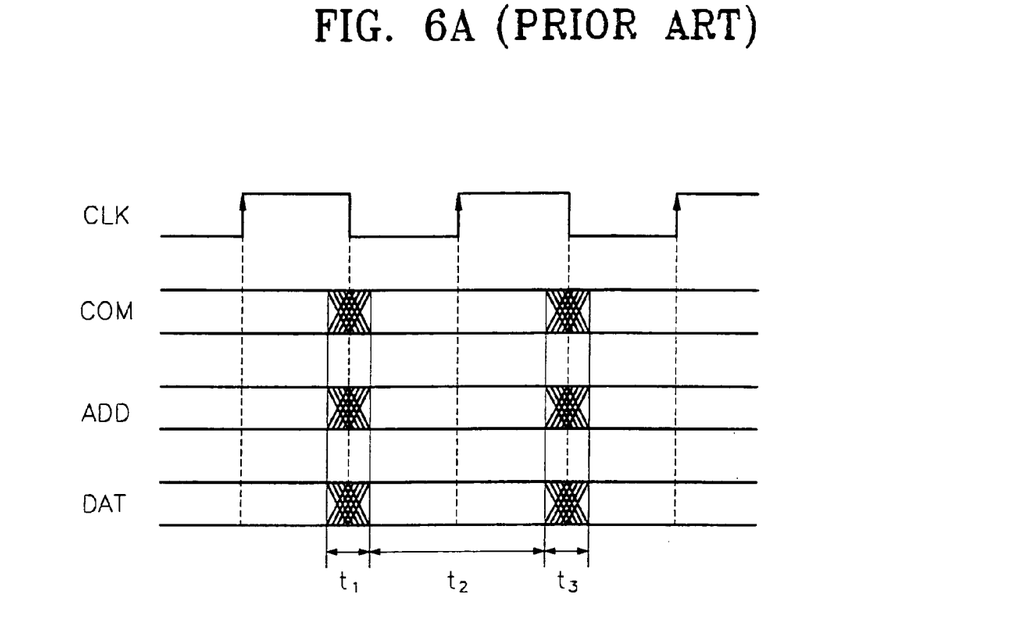
FIG. 6A is a timing diagram that illustrates the valid data window of a conventional memory system.
Figure 6B:
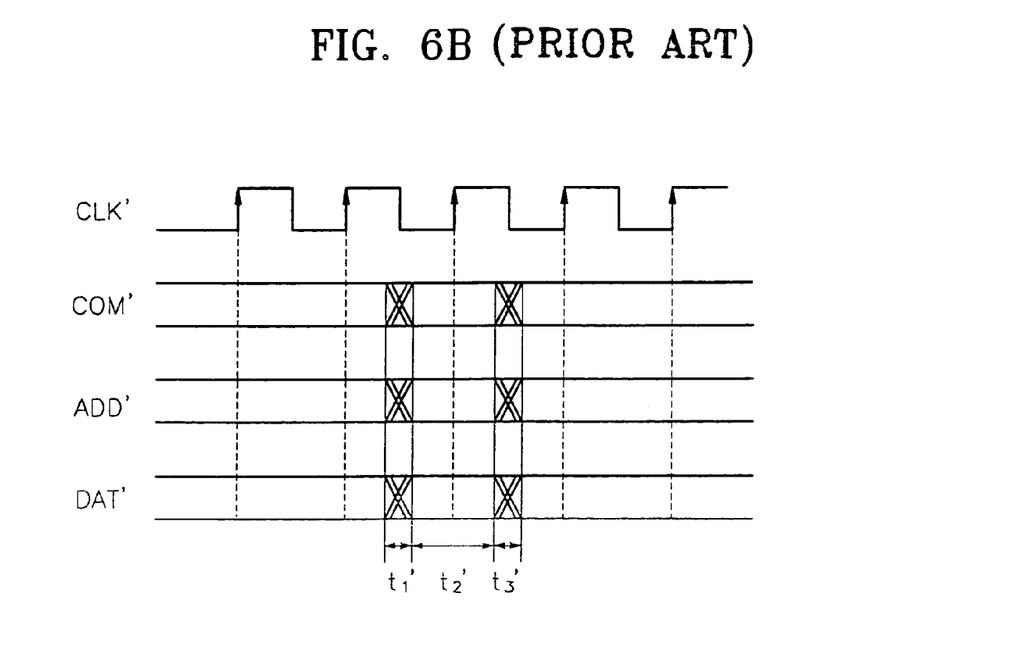
FIG. 6B is a timing diagram that illustrates the valid data window of memory systems in accordance with embodiments of the present invention.

FIGS. 6A and 6B are timing diagrams that illustrate the valid data window of a conventional memory system and the valid data window of a memory system in accordance with embodiments of the present invention, respectively. FIG. 6A shows skew in a conventional memory system that is generated due to differences in the arrival time of signals. Accordingly, the skew may reduce the valid data window time period. Time t1 illustrates a data setup time that is increased due to skew between signals and/or differences in signal transmission time. Time t3 illustrates a data hold time that is increased due to skew between signals and/or differences in signal transmission time. Time t2 denotes a valid data window reduced by the times t1 and t3.

FIG. 6B shows the valid data window according to embodiments of the present invention. Time t1' illustrates a data setup time that is increased due to skew between signals and/or differences in signal transmission time. Time t3' illustrates a data hold time that is increased due to skew between signals and/or differences in signal transmission time. Time t2' denotes a valid data window reduced by the times t1' and t3'.

Because times t1' and t3' are less than times t1 and t3 of FIG. 6A, respectively, the valid data window time period may be shorter than that provided by conventional memory systems. Accordingly, memory systems, in accordance with embodiments of the present invention, may operate at higher frequencies.

Many variations and modifications can be made to the preferred embodiments without substantially departing from the principles of the present invention. All such variations and modifications are intended to be included herein within the scope of the present invention, as set forth in the following claims.

We claim:

1. A semiconductor memory device controlled by a memory controller, comprising:
   a delay control register for receiving delay control information that is based on a position of the memory device from the memory controller and storing the received delay control information; and
   an input buffer for receiving a command signal, an address signal, and write data from the memory controller and delaying the received command signal, address signal, and write data,
   wherein the delay time of the input buffer is controlled in response to an output signal of the delay control register.

2. The semiconductor memory device of claim 1, wherein the input buffer comprises:
   a delay controller for setting a predetermined delay time in response to the output signal of the delay control register;
   a data input buffer for delaying the write data in response to the output signal of the delay controller;
   an address input buffer of delaying the address signal in response to the output signal of the delay controller; and
   a command input buffer for delaying the command signal in response to the output signal of the delay controller.

3. A memory controller for controlling memory modules, into which a plurality of semiconductor memory devices are loaded, comprising:
   a module selector for outputting a module selection signal for selecting the memory modules in response to a clock signal;
   a delay control register for receiving delay control information that is based on positions of the semiconductor memory device according to a specification from serial presence detectors (SPD) loaded into the memory modules and storing the received delay control information; and
   an output buffer for delaying an internal command signal, an internal address signal, and write data in response to the output signal of the module selector and outputting the delayed write data to the semiconductor memory device,
   wherein the delay time of the output buffer is controlled in response to the output signal of the delay control register.

4. The memory controller of claim 3, wherein the memory controller further comprises an input buffer, whose delay time is controlled in response to the output signal of the delay control register, the input buffer for delaying read data received from the semiconductor memory device and outputting the delayed read data to the inside of the memory controller.

5. The memory controller of claim 3, wherein the module selection signal comprises:
   a first signal for selecting a memory module, which does not need a predetermined delay time; and
   a second signal for selecting a memory module, which needs the predetermined delay time.

6. The memory controller of claim 5, wherein the output buffer comprises:
   a delay controller for receiving the output signal of the delay control register and the second signal and setting a predetermined delay time;
   a command output buffer for delaying a command signal in response to the output signal of the delay controller and the first signal;
   an address output buffer for delaying an address signal in response to the output signal of the delay controller and the first signal; and
   a data output buffer for delaying write data in response to the output signal of the delay controller and the first signal.

7. The memory controller of claim 4, wherein the input buffer comprises:
   a delay controller for setting a predetermined delay time in response to the output signal of the delay control register; and
   a data input buffer for delaying read data received from the semiconductor memory device and outputting the delayed read data to the inside thereof in response to the output signal of the delay controller.

8. A memory system comprising memory modules, into which a plurality of semiconductor memory devices are loaded, and a memory controller for controlling the memory modules,
   wherein the memory modules comprises SPDs for storing predetermined control information that is based on positions of the memory devices according to the specification of the memory module,
   and wherein the memory controller comprises:
   a delay control register for receiving the predetermined delay information from the SPDs and storing the received delay control information; and
   an output buffer, whose delay time is controlled in response to the output signal of the delay control register, the output buffer for delaying a command signal, an address signal, and write data, and outputting the delayed command signal, address signal, and write data to the semiconductor memory device.

9. The memory system of claim 8, wherein the memory controller further comprises an input buffer, whose delay time is controlled in response to the output signal of the delay control register, the input buffer for delaying read data received from the semiconductor memory device and outputting to the inside of the memory controller.

10. The memory system of claim 9, wherein the input buffer comprises:
    a delay controller for setting a predetermined delay time in response to an enable signal and the output signal of the delay control register; and
    a data input buffer for delaying read data received from the semiconductor memory device and outputting the delayed read data to the inside thereof in response to the output signal of the delay controller.

11. The memory system of claim 8, wherein the output buffer comprises:

a delay controller for receiving the output signal of the delay control register and the second signal and setting a predetermined delay time;

a command output buffer for delaying a command signal in response to the output signal of the delay controller and a first signal;

an address output buffer for delaying an address signal in response to the output signal of the delay controller and a first signal; and a data output buffer for delaying write data in response to the output signal of the delay controller and a first signal.

12. The memory system of claim 8, wherein each of the semiconductor memory devices comprises:

a delay control register for receiving delay control information from the memory controller and storing the received delay control information; and an input buffer for receiving a command signal, an address signal, and write data from the memory controller and delaying the received command signal, address signal, and write data, wherein the delay time of the input buffer is controlled in response to the output signal of the delay control register.

13. The memory system of claim 12, wherein the input buffer comprises:

a delay controller for setting a predetermined delay time in response to the output signal of the delay control register;

a data input buffer for delaying the write data in response to the output signal of the delay controller;

an address input buffer for delaying the address signal in response to the output signal of the delay controller; and a command input buffer for delaying the command signal in response to the output signal of the delay controller.

14. A method for controlling the delay time of an input signal input to a semiconductor memory device controlled by a memory controller, comprising the steps of:

receiving delay control information that is based on a position of the semiconductor memory device from the memory controller and storing the received delay control information;

setting a predetermined delay time in response to the stored delay control information; and controlling the delay time of a signal input to the semiconductor memory device by the predetermined delay time.

15. The method of claim 14, wherein the input signal is a command signal, an address signal, and write data.

16. A method for controlling a delay time of an output signal of a memory controller output to memory modules, into which a plurality of semiconductor memory devices are loaded, comprising the steps of:

receiving delay control information that is based on positions of the semiconductor memory devices according to the specification of the memory modules from SPDs loaded into the memory modules and storing the received delay control information;

outputting a module selection signal for selecting the memory modules in response to a clock signal;

setting a predetermined delay time in response to the stored delay control information and a first signal; and controlling the delay time of the output signal output to the semiconductor memory device by the delay time.

17. The method of claim 16, wherein the method for controlling the delay time further comprises the step of controlling the delay time of a signal input from the semiconductor memory device to the memory controller by the delay time.

18. The method of claim 16, wherein the output signal is a command signal, an address signal, and write data.

19. The method of claim 16, wherein the module selection signal comprises:

a first signal for selecting a memory module, which does not need a predetermined delay time; and a second signal for selecting a memory module, which needs the predetermined delay time.

20. A method for controlling the delay time of a signal between memory modules, into which a plurality of semiconductor memory device are loaded, and a memory controller for controlling the memory modules, comprising the steps of:

receiving delay control information that is based on positions of the semiconductor memory devices according to the specifications of the memory modules from SPDs loaded into the memory modules and storing the received delay control information;

outputting a module selection signal for selecting the memory modules in response to the clock signal;

setting a predetermined delay time in response to the stored delay control information and a first signal;

outputting the delay control information to the semiconductor memory device by the delay time;

receiving the delay control information from the memory controller and storing the received delay control information;

setting a predetermined delay time in response to the stored delay control information; and controlling the delay time of a signal input to the semiconductor memory device by the predetermined delay time.

21. The method of claim 20, wherein the signal is a command signal, an address signal, and write data.

22. The method of claim 20, wherein the delay time further comprises the step of controlling the delay time of a signal input from the semiconductor memory device to the memory controller by the predetermined delay time.

23. The method of claim 20, wherein the module selection signal comprises:

a first signal for selecting a memory module, which does not need the predetermined delay time; and a second signal for selecting a memory module, which does not need the predetermined delay time.

24. An integrated circuit memory system, comprising:

a plurality of memory modules, a respective one of which being responsive to a control signal and having delay control information that is based on position of the memory module stored thereon; and a memory controller that is configured to generate the control signal in response to the delay control information.

25. The integrated circuit memory system of claim 24, wherein the memory controller further comprises:

a delay control register that is configured to receive and to store the delay control information therein; and an output buffer that is configured to generate the control signal in response to an input control signal and the delay control information stored in the delay control register.

26. The integrated circuit memory system of claim 25, wherein each of the plurality of memory modules has delay control information stored thereon, and wherein the delay control information comprises a transmission delay value between the memory controller and the respective memory module, the integrated circuit memory system further comprising:

a delay controller that is configured to generate a delay signal in response to an activated select signal and to the delay control information stored in the delay control register, the output buffer being responsive to the delay signal; and a module selector that is configured to deactivate the select signal if the transmission delay value associated with the respective one of the plurality of memory modules is greater than or equal to the transmission delay values associated with the other ones of the plurality of memory modules.

27. The integrated circuit memory system of claim 25, wherein the memory controller further comprises:

an input buffer that is configured to receive data from the respective one of the plurality of memory modules at an input thereof and to provide the received data at an output thereof in response to the delay control information stored in the delay control register.

28. The integrated circuit memory system of claim 25, wherein the control signal comprises a command control signal, an address control signal, and data, and wherein the output buffer comprises a command output buffer that is configured to generate the command control signal in response to an input command control signal and the delay control information stored in the delay control register, an address output buffer that is configured to generate the address control signal in response to an input address control signal and the delay information stored in the delay control register, and a data output buffer that is configured to generate the data in response to input data and the delay information stored in the delay control register.

29. The integrated circuit memory system of claim 24, wherein at least one of the plurality of memory modules comprises a plurality of memory devices.

30. The integrated circuit memory system of claim 29, wherein the control signal is a first control signal, and wherein a respective one of the plurality of memory devices comprises:

a delay control register that is configured to receive at least some of the delay control information and to store the at least some of the delay control information therein;

an input buffer that is configured to generate a second control signal in response to the first control signal and the delay control information stored in the delay control register; and a memory cell array that is responsive to the second control signal.

31. A memory controller for use in a memory having a memory module, the memory controller comprising:

a delay control register that is configured to receive and to store delay control information associated with the memory module therein, the delay control information comprising a transmission delay value between the memory controller and the memory module;

an output buffer that is configured to generate a control signal for the memory module in response to an input control signal and the delay control information stored in the delay control register;

a delay controller that is configured to generate a delay signal in response to an activated select signal and to the delay control information stored in the delay control register, the output buffer being responsive to the delay signal; and a module selector that is configured to deactivate the select signal in response to the transmission delay value.

32. The memory controller of claim 31, further comprising:

an input buffer that is configured to receive data from the memory module and to provide the received data at an output thereof in response to the delay control information stored in the delay control register.

33. The memory controller of claim 31, wherein the control signal comprises a command control signal, an address control signal, and data, and wherein the output buffer comprises a command output buffer that is configured to generate the command control signal in response to an input command control signal and the delay control information stored in the delay control register, an address output buffer that is configured to generate the address control signal in response to an input address control signal and the delay information stored in the delay control register, and a data output buffer that is configured to generate the data in response to input data and the delay information stored in the delay control register.

34. A method of operating an integrated circuit memory device that comprises a memory cell array and is communicatively coupled to a memory controller, the method comprising:

receiving delay control information from that is based on a position of the memory device from the memory controller at the memory device;

delaying a control signal based on the delay control information; and providing the delayed control signal to the memory cell array.

35. The method of claim 34, wherein delaying the control signal, comprises:

receiving the control signal from the memory controller at the memory device.

* * * * *

UNITED STATES PATENT AND TRADEMARK OFFICE
CERTIFICATE OF CORRECTION

PATENT NO.       : 7,246,250 B2
APPLICATION NO.  : 09/941091
DATED            : June 17, 2007
INVENTOR(S)      : Jung et al.

It is certified that error appears in the above-identified patent and that said Letters Patent is hereby corrected as shown below:

In The Claims:

Column 9, Claim 3, Line 52: Please correct "memory device":
        To read -- memory devices --

Column 10, Claim 8, Line 39: Please correct "according to the"
        To read -- according to a --

Column 10, Claim 8, Line 43: Please correct "delay information"
        To read -- control information --

Column 10, Claim 8, Line 44: Please correct "delay control"
        To read --predetermined control --

Column 10, Claim 8, Line 46: Please correct "respond to the"
        To read -- respond to an --

Column 11, Claim 12, Line 15: Please correct "receiving delay control"
        To read -- receiving the control --

Column 11, Claim 12, Line 17: Please correct "received delay control"
        To read -- received control --

Column 12, Claim 20, Line 12: Please correct "controlling the delay"
        To read -- controlling delay --

Column 12, Claim 24, Line 51: Please correct "that is based on position"
        To read -- that is based on a position --

Column 14, Claim 34, Line 37: Please correct "operating an integrated circuit memory"
    To read -- operating a memory --

UNITED STATES PATENT AND TRADEMARK OFFICE
CERTIFICATE OF CORRECTION

PATENT NO. : 7,246,250 B2
APPLICATION NO. : 09/941091
DATED : June 17, 2007
INVENTOR(S) : Jung et al.

It is certified that error appears in the above-identified patent and that said Letters Patent is hereby corrected as shown below:

Column 14, Claim 34, Line 41: Please correct "information from that is"
To read -- information that is --

Signed and Sealed this

Sixteenth Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 7,246,250 B2
APPLICATION NO. : 09/941091
DATED : July 17, 2007
INVENTOR(S) : Jung et al.

It is certified that error appears in the above-identified patent and that said Letters Patent is hereby corrected as shown below:

In The Claims:

Column 9, Claim 3, Line 52: Please correct "memory device":
        To read -- memory devices --

Column 10, Claim 8, Line 39: Please correct "according to the"
        To read -- according to a --

Column 10, Claim 8, Line 43: Please correct "delay information"
        To read -- control information --

Column 10, Claim 8, Line 44: Please correct "delay control"
        To read --predetermined control --

Column 10, Claim 8, Line 46: Please correct "respond to the"
        To read -- respond to an --

Column 11, Claim 12, Line 15: Please correct "receiving delay control"
        To read -- receiving the control --

Column 11, Claim 12, Line 17: Please correct "received delay control"
        To read -- received control --

Column 12, Claim 20, Line 12: Please correct "controlling the delay"
        To read -- controlling delay --

Column 12, Claim 24, Line 51: Please correct "that is based on position"
        To read -- that is based on a position --

Column 14, Claim 34, Line 37: Please correct "operating an integrated circuit memory"
    To read -- operating a memory --

UNITED STATES PATENT AND TRADEMARK OFFICE
CERTIFICATE OF CORRECTION

PATENT NO.         : 7,246,250 B2
APPLICATION NO. : 09/941091
DATED                 : July 17, 2007
INVENTOR(S)       : Jung et al.

It is certified that error appears in the above-identified patent and that said Letters Patent is hereby corrected as shown below:

Column 14, Claim 34, Line 41: Please correct "information from that is"
To read -- information that is --

This certificate supersedes Certificate of Correction issued October 16, 2007.

Signed and Sealed this

Thirteenth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,246,250 B2  Page 1 of 1
APPLICATION NO. : 09/941091
DATED : July 17, 2007
INVENTOR(S) : Jung et al.

It is certified that error appears in the above-identified patent and that said Letters Patent is hereby corrected as shown below:

Column 12, claim 20, line 12: Please correct "controlling the delay" to read --controlling a delay--.

Signed and Sealed this

Twenty-fifth Day of March, 2008

JON W. DUDAS
*Director of the United States Patent and Trademark Office*